(12) United States Patent
Susini et al.

(10) Patent No.: US 9,907,196 B2
(45) Date of Patent: Feb. 27, 2018

(54) ELECTRICAL MODULE

(71) Applicant: SAGEMCOM BROADBAND SAS, Rueil Malmaison (FR)

(72) Inventors: Dominique Susini, Rueil Malmaison (FR); Daniel Siron, Rueil Malmaison (FR); Etienne Evrard, Rueil Malmaison (FR); Nicolas Dangy-Caye, Rueil Malmaison (FR); Radu Nedelcu, Rueil Malmaison (FR)

(73) Assignee: SAGEMCOM BROADBAND SAS, Rueil Malmaison (FR)

( * ) Notice: Subject to any disclaimer, the term of this patent is extended or adjusted under 35 U.S.C. 154(b) by 0 days.

(21) Appl. No.: 15/039,643

(22) PCT Filed: Dec. 2, 2014

(86) PCT No.: PCT/EP2014/076318
§ 371 (c)(1),
(2) Date: May 26, 2016

(87) PCT Pub. No.: WO2015/082503
PCT Pub. Date: Jun. 11, 2015

(65) Prior Publication Data
US 2017/0172003 A1 Jun. 15, 2017

(30) Foreign Application Priority Data
Dec. 5, 2013 (FR) ...................................... 13 62212

(51) Int. Cl.
*H05K 7/00* (2006.01)
*H05K 5/02* (2006.01)
(Continued)

(52) U.S. Cl.
CPC ........... *H05K 5/0256* (2013.01); *H01R 13/60* (2013.01); *H01R 27/02* (2013.01); *H05K 5/0021* (2013.01);
(Continued)

(58) Field of Classification Search
CPC ........ H01R 13/60; H01R 27/02; H05K 7/026; H05K 5/0256; H05K 5/0021; G06F 2200/1635
See application file for complete search history.

(56) References Cited

U.S. PATENT DOCUMENTS 6,780,047 B1 * 8/2004 Laity ...................... H01R 13/72
439/501
6,909,046 B2 * 6/2005 Laity ...................... H01R 13/72
174/50
(Continued)

FOREIGN PATENT DOCUMENTS

WO        WO 01/74015 A1    10/2001

*Primary Examiner* — Robert J Hoffberg
*Assistant Examiner* — Hung Dang
(74) *Attorney, Agent, or Firm* — Muncy, Geissler, Olds & Lowe, P.C.

(57) ABSTRACT

The invention concerns an electrical module suitable for operating while optionally being connected to at least one other electrical module of the same type, the electrical module comprising a housing on which are arranged first connection means suitable for connecting the electrical module to an external power source and second connection means allowing the electrical module to exchange first data with the outside, the electrical module further comprising linking means suitable for connecting the electrical module to another electrical module of the same type in order to transmit linking data and/or a linking power supply thereto.

8 Claims, 2 Drawing Sheets

(51) Int. Cl.
*H01R 27/02* (2006.01)
*H01R 13/60* (2006.01)
*H05K 7/02* (2006.01)
*H05K 5/00* (2006.01)

(52) U.S. Cl.
CPC ..... *H05K 7/026* (2013.01); *G06F 2200/1635* (2013.01)

(56) References Cited

U.S. PATENT DOCUMENTS

| | | | |
|---|---|---|---|
| 7,038,138 B2 * | 5/2006 | Laity | H01R 13/72 174/113 R |
| 8,943,227 B2 * | 1/2015 | Klughart | G06F 3/0608 710/2 |
| 2006/0094291 A1 | 5/2006 | Caveney et al. | |

* cited by examiner

ELECTRICAL MODULE

The invention relates to an electrical module adapted to operate while optionally connected to at least one other electrical module of the same type.

BACKGROUND OF THE INVENTION

Certain home electrical installations require a plurality of pieces of electrical equipment or modules to be connected together. Such installations include a "multimedia installation" e.g. combining an Internet gateway, a TV decoder, a video game console, etc. It is also possible to mention a "Hi-Fi" audio installation, e.g. combining an amplifier, a CD deck, a tuner, etc.

Numerous electric cables are used in installations of this type for connecting each electrical module to a mains electricity outlet, for connecting one or more electrical modules to the Internet, for connecting the modules to one another so as to enable data to be exchanged between the modules, etc.

Using these numerous cables raises certain problems. The cables make the electrical installation unattractive in appearance, and they sometimes require complex operations to be initiated in order to hide them. Such an electrical installation also requires a certain number of mains electricity outlets to be available in the proximity of the installation, or else the use of an additional power strip in order to connect each electrical module to mains. Finally, connecting the various electrical modules to one another is relatively complex and can present difficulties for an inexperienced user.

OBJECT OF THE INVENTION

An object of the invention is to provide an electrical module adapted for being integrated in an electrical installation of the kind mentioned above and that in use enables the number of cables and mains electricity outlets needed to operate the installation to be reduced, and that simplifies connecting modules within the installation.

SUMMARY OF THE INVENTION

In order to achieve this object, there is provided an electrical module adapted to operate while optionally connected to at least one other electrical module of the same type. The electrical module comprises a box having arranged thereon first connection means suitable for connecting the electrical module to an external power supply, and second link means enabling the electrical module to exchange first data externally. The electrical module also includes connection means that are fastened to the box and that are adapted to connect the electrical module to another electrical module of the same type in order to convey thereto link data and/or a link power supply.

When a plurality of electrical modules of the invention are connected together within a single electrical installation, they are connected to one another via the connection means. Thus, it suffices for a single electrical module to be connected to a mains electricity outlet to enable all of the modules to be powered, the electrical module that is connected to the mains outlet supplying the link power supply to the other electrical modules via the link means in order to power them. Likewise, the electrical modules can exchange link data with one another via the link means. This greatly reduces the number of electrical power supply and data transmission cables that are needed in the installation, thereby improving the appearance of the installation. The number of mains electricity outlets that are needed is also reduced. In addition, connecting electrical modules within the installation consists merely in connecting a standard power supply cable to one electrical module and connecting the other electrical modules to one another via the link means, thereby greatly simplifying connection operations and reducing any risk of connection error.

The invention can be better understood in the light of the following description of a particular, non-limiting embodiment of the invention.

BRIEF DESCRIPTION OF THE DRAWINGS

Reference is made to the accompanying drawings, in which:

FIG. 5b shows a male plug of link means complementary to the female plug shown in FIG. 5a;

FIG. 6b shows a male plug of link means complementary to the female plug shown in FIG. 6a;

FIG. 7b shows a male plug of link means complementary to the female plug shown in FIG. 7a;

FIG. 8b shows a male plug of link means complementary to the female plug shown in FIG. 8a.

DETAILED DESCRIPTION OF THE INVENTION

Figure 1:
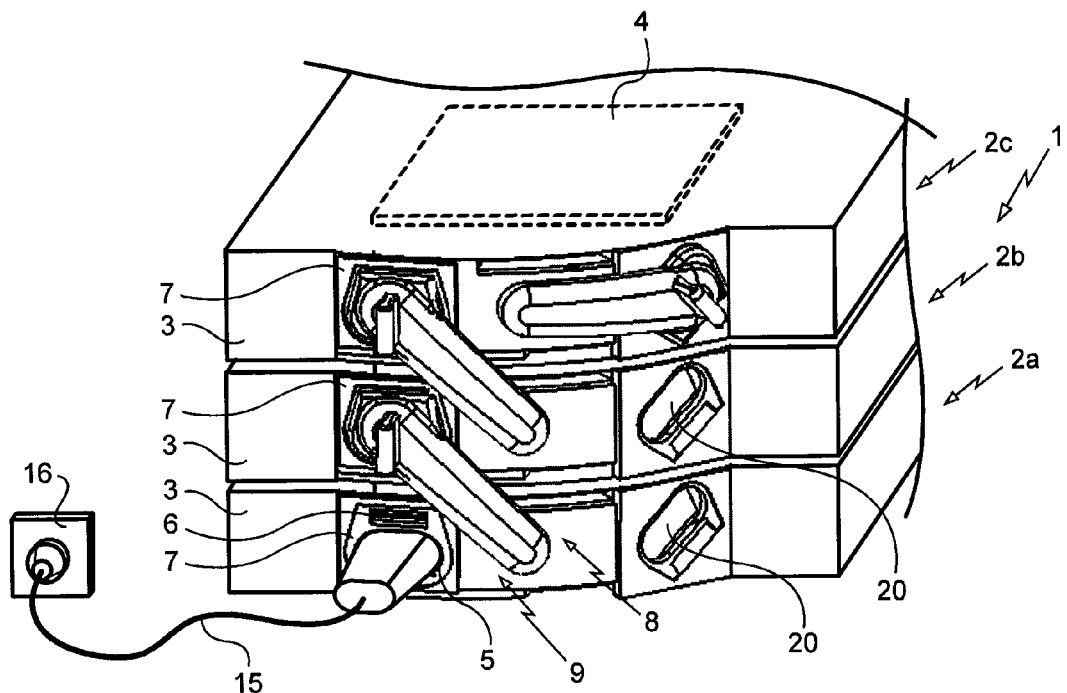
FIG. 1 is a perspective view of three electrical modules of the invention.

With reference to FIG. 1, the invention is illustrated by a home electrical installation 1 comprising first, second, and third electrical modules 2a, 2b, and 2c of the invention. In the context of a multimedia installation, it can comprise, by way of example: a home Internet gateway; a television decoder; and a video game console; said multimedia installation then also including a TV set (not shown) connected to the above-mentioned electrical modules.

Each of the electrical modules 2 is adapted to operate by being connected or not connected to another electrical module of the same type. The term "same type" is used to mean that the electrical modules possess compatible electrical interfaces and are adapted to co-operate so that together they perform at least one particular function. Thus, once more in the context of a multimedia installation, the video game console can operate independently but it can also be connected to the home gateway in order to receive data from the Internet, e.g. for interacting with other players.

Each electrical module 2 comprises a box 3 containing at least one electrical card 4 adapted to perform functions specific to the electrical module 2 and possibly particular functions resulting from co-operation between modules, if any.

First connection means 5 and second connection means 6 combined in a single first electrical connector 7, specifically a female connector, and link means 8 are arranged on each box 3.

The first connection means 5 are for connecting the electrical module to a power supply that is external to the module in question. The term "external power supply" is used interchangeably to cover a power supply coming from a mains electricity outlet and a power supply coming from another electrical module 2.

The second connection means 6 enable the electrical module 3 to exchange first data externally relative to the electrical module 3. The term "externally relative to the electrical module" is used herein to mean that first data is exchanged with any piece of equipment or with some other electrical module 2.

Figure 2:
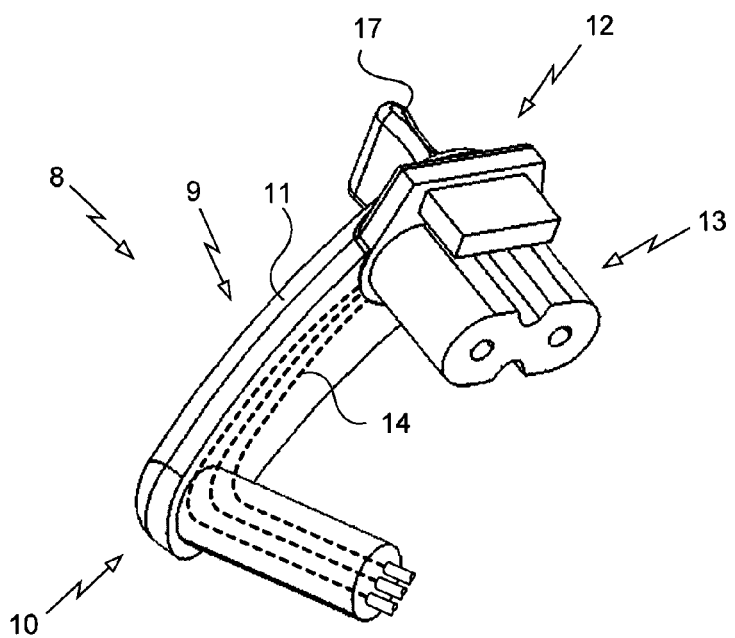
FIG. 2 shows the link means of the electrical module of the invention.

The link means 8 comprise an arm 9 that can be seen more clearly in FIG. 2, which itself has a first end 10 fastened to the box 3, a body 11, a second end 12 having a male second electrical connector 13 complementary to the first electrical connector 7, and a grip zone 17 situated on the second end 12. Electric cables 14 connecting the first end 10 with the second electrical connector 13 pass inside the body 11 of the arm 9.

The first electrical connector 7 and the arm 9 of the electrical modules 3 are thus used firstly to provide a power supply for the three electrical modules 2 of the home electrical installation, and secondly to exchange link data between the three electrical modules 2.

There follows a description in greater detail of how the first electrical module 2a, the second electrical module 2b, and the third electrical module 2c are electrically connected together.

The first electrical module 2a is connected via the first connection means 5 of the first electrical connector 7 of the first electrical module 2a and via a standard power supply cable 15 to a mains electricity outlet 16. The electrical card 4 of the first electrical module 2a has a power supply circuit that is thus powered by the voltage from the mains electricity outlet 16. The power supply circuit of the electrical card 4 of the first electrical module 2a provides one or more power supplies for the remainder of the electrical card 4 and also a link power supply to the second module 2b via the arm 9 of the first electrical module 2a, said link power supply being adapted to power the electrical card 4 of the second electrical module 2b.

Furthermore, the electrical card 4 of the electrical module 2a and the electrical card 4 of the electrical module 2b exchange link data via the arm 9 of the first electrical module 2a. The second electrical connector 13 of the arm 9 of the first electrical module 2a is connected for this purpose to the first electrical connector 7 of the second electrical module 2b.

The second electrical module 2b is thus powered by the first electrical module 2a, and it is adapted to exchange link data with the first electrical module 2a.

The second electrical module 2b is also connected to the third electrical module 2c. The electrical card 4 of the second electrical module 2b provides a link power supply to the third electrical module 2c via the arm 9 of the second electrical module 2b. The electrical card 4 of the second electrical module 2b and the electrical card 4 of the third electrical module 2c also exchange link data via the arm 9 of the second electrical module 2b. The second electrical connector 13 of the arm 9 of the second electrical module 2b is connected for this purpose to the first electrical connector 7 of the third electrical module 2c.

The third electrical module 2c is thus powered by the second electrical module 2b, and it is adapted to exchange link data with the second electrical module 2b.

Thus, the link data exchanged between the first electrical module 2a and the third electrical module 2c transits via the second electrical module 2b.

It should thus be observed that the arms 9 of the first electrical module 2a and of the second electrical module 2b are respectively connected to the second electrical module 2b and to the third electrical module 2c, whereas the arm 9 of the third electrical module 2c is not used. The term "connection position" is used to designate the position occupied by the arms 9 of the electrical modules 2a and 2b, which are connected to another electrical module, and the term "rest position" is used to designate the position occupied by the arm 9 of the third module 2c, which is not connected to another electrical module.

Each box 3 of an electrical module 2 has a dummy female electrical connector 20 complementary to the second electrical connector 13 and adapted to receive the second electrical connector 13 when the arm is positioned in its rest position. The first end 10 of the arm 9 is pivotally mounted on the box 3 so that a user can selectively position the arm 9 in the connection position or in the rest position by taking hold of the grip zone 17 by hand and pivoting the arm.

The arm 9 has a length that is determined as a function of the height of the modules 2 but that is sufficient to make it possible to interconnect electrically the two modules.

In this example the arm 9 is secured to the box 3 of the electrical module 2 and cannot be removed. Alternatively, provision could be made for an arm 9 that is releasably fastened to the box 3 so as to be separable from the box 3 and possibly mounted on some other electrical module 2.

Figure 3:
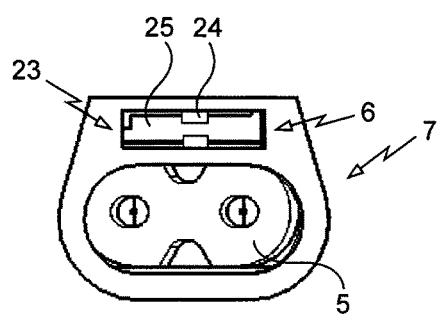
FIG. 3 shows a first electrical connector of the electrical module of the invention.
Figure 4:
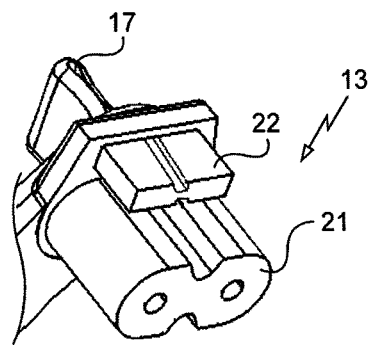
FIG. 4 shows a second electrical connector of the link means of the electrical module of the invention.

There follows a description in greater detail of the first electrical connector 7 of an electrical module 2 and the second electrical connector 13 of an arm 9, with reference to FIGS. 3 and 4.

The first electrical connector 7 is a female connector combining the first connection means 5 suitable for conveying a power supply, and the second connection means 6 suitable for conveying digital data. The second electrical connector 13 is a male connector complementary to the first connector and it has third connection means 21 complementary to the first connection means 5 and fourth connection means 22 complementary to the second connection means 6 of the electrical module 2.

The electrical connector 13 is oriented relative to the arm 9 as a function of the angle made by the arm 9 when it is interconnecting two modules 2.

The first connection means 5 of the first connector 7 comprise a standard female electrical power supply connector of type C7 complying with the IEC 60320-1 standard. The third connection means 21 of the second electrical connector 13 thus comprise a standard male electrical power supply connector of type C7 in compliance with the IEC 60320-1 standard. Thus, an electrical module 2 can equally well be powered from a mains electricity outlet via an electric cable having a male electrical connector at its free end in compliance with the above-mentioned standards, as shown for the first electrical module 2a, or by another electrical module, as shown for the second and third electrical modules 2b and 2c.

Advantageously, the second connection means 6 of the first electrical connector 7 comprise a non-standard female electrical connector 23 having mechanical safety means 24 so as to be capable of being connected solely to an arm 9 of another electrical module. The first data exchanged externally by each electrical module via the arm 9 is constituted solely by link data coming from another module.

The female electrical connector 23 of the second connection means comprise a female plug 30 defining a connection housing 25 within which contacts are arranged in compliance with the HDMI standard.

The mechanical safety means are adapted to prevent a standard HDMI male connector connecting with the female electrical connector 23. Thus, a user cannot in error connect a standard HDMI connector coming from equipment of some other type (e.g. a camcorder) to the female electrical connector 23 of an electrical module 2.

Figure 5A:
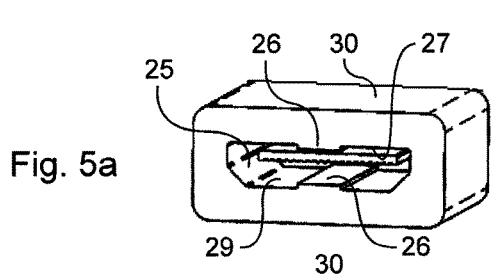
FIG. 5a shows a female plug of a female electrical connector of the electrical module of the invention in a first embodiment.

With reference to FIG. 5a, the mechanical safety means 24 are defined by an inside shape of the connection housing 25, which inside shape presents at least one spline 26 situated on at least one inside surface of the connection housing. Specifically, the inside shape of the connection housing 25 presents a first spline 26 situated at the center of a top inside face 27 of the connection housing and a second spline 26 situated at the center of a bottom inside face 29 of the connection housing 25.

Figure 5B:
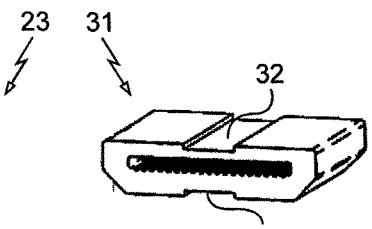

When the female electrical connector 23 includes the mechanical safety means 24 of the first embodiment, the fourth connection means 22 include a male plug 31, shown in FIG. 5b that is complementary to the female plug in question, i.e. a male plug having contacts arranged in compliance with the HDMI standard, and with an outside shape that presents two slots 32 complementary to the splines 26 of the connection housing 25 of the female plug 30 of the female electrical connector 23.

Figure 6A:
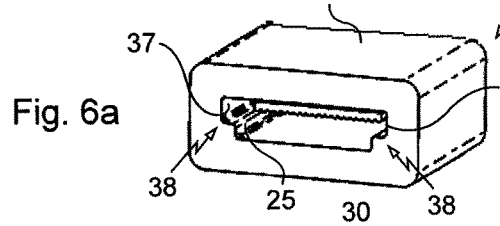
FIG. 6a shows a female plug of a female electrical connector of the electrical module of the invention in a second embodiment.
Figure 6B:
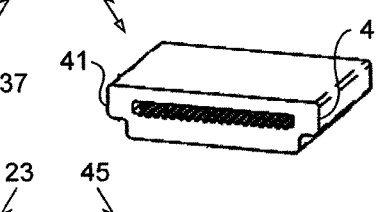

In the second embodiment shown in FIG. 6a, the mechanical safety means 24 are defined by an inside shape of the connection housing 25 that is defined by two side walls 37, each provided with a spline of square or rectangular section 38 extending in a direction for inserting the male plug of the corresponding male electrical connector into the housing. The male plug 40 of the fourth connection means 22 then includes complementary slots 41 of square or rectangular section arranged to receive the splines 38.

Figure 7A:
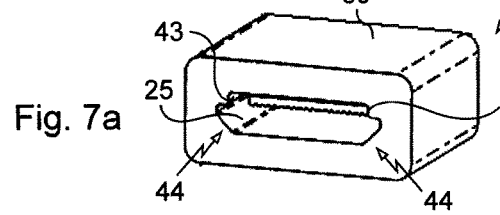
FIG. 7a shows a female plug of a female electrical connector of the electrical module of the invention in a third embodiment.
Figure 7B:
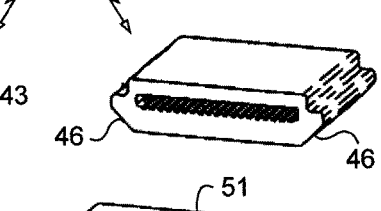

In a third embodiment, shown in FIG. 7a, the connection housing 25 is defined by two side walls 43, each of which has a slot of triangular section 44 formed therein. The male plug 45 of the fourth connection means then has complementary splines 46 of triangular section.

Figure 8A:
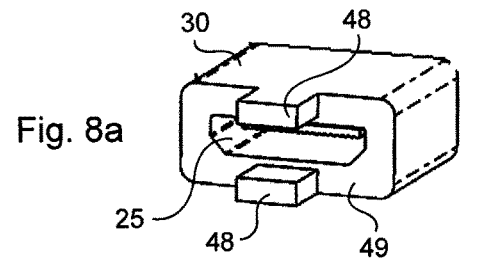
FIG. 8a shows a female plug of a female electrical connector of the electrical module of the invention in a fourth embodiment.
Figure 8B:
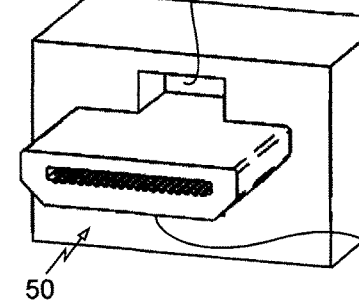

In a fourth embodiment, shown in FIG. 8a, the mechanical safety means 24 comprise at least one protuberance 48 projecting from a front face 49 of the female plug 30 in order to extend parallel to the direction for engaging the male plug 50 in the female plug 30. Specifically, the female plug 30 has two protuberances 48 situated on either side of the connection housing 25. The male plug 50 of the fourth connection means 22 then has two reception housings 51 complementary to the protuberances 48. These protuberances 48 are of a length that is sufficient to enable no more than partial insertion of a standard HDMI male plug into the female plug of the female electrical connector, while preventing any electrical connection between the contacts of those two plugs.

The invention is not limited to the particular embodiments described above, but on the contrary covers any variant coming within the ambit of the invention as defined by the claims.

The box of the electrical module may naturally include other connection means enabling the electrical module to be connected to an external power supply or to some other equipment. In particular, the box may include a standard additional connector arranged on the box and enabling the electrical module to exchange second data externally, said additional connector being, for example, a standard connector giving access to the Internet via a standard cable.

The second connection means may be of standards other than the HDMI standard, and for example they may be of the USB, Firewire, etc. standards.

The arm may be telescopic and the connection means 21 and 22 may be mounted on swivel supports.

The link data may be sent by the electrical module 2a for the attention of the electrical module 2c, in which case it merely transits via the electrical module 2b, or it may be sent by the electrical module 2b for the attention of the electrical module 2c.

The invention claimed is:

1. An electrical module with a connector to at least one other electrical module, the electrical module comprising:
   a box having a first socket connecting the electrical module to an external power supply, and a second socket on the electrical module to exchange first data externally, the first socket and the second socket being grouped together in a single linking socket;
   a data link fastened to the box and extending from the box, wherein the data link comprises an arm having a first end fastened to the box and a second end having an adaptor, the adaptor connecting to a single linking socket of a first external electrical module of the at least one other electrical module,
   wherein the arm of the data link rotatable relative to a surface of the box at the first end so that the data link connects with the first external electrical module in a connection position, and
   wherein wires pass through the arm of the data link and the arm of the data link has a rest position in which the adaptor is not connected to the first external electrical module.

2. The electrical module according to claim 1, wherein the data link is fastened to the box in releasable manner and separable from the electrical module.

3. The electrical module according to claim 1, wherein the data link includes a grip zone at the second end and the wires running inside the arm between the first end and the second end.

4. The electrical module according to claim 1, wherein the box further includes a dummy socket complementary to the adaptor to receive the adaptor when the data link is in the rest position.

5. The electrical module according to claim 1, wherein the second socket includes a mechanical safety so that the second socket can only receive a data link of another electrical module identical to the data link of the electrical module.

6. The electrical module according to claim 1, further including another linking socket arranged on the box for exchange of second data externally.

7. The electrical module according to claim 1, wherein the first end of the data link connects to the box at the surface of the box and rotates parallel to the surface of the box in a plane.

8. The electrical module according to claim 1, wherein the arm of the data link extends parallel to the plane and the arm rotates the adaptor at the second end from the connection position to the rest position.

\* \* \* \* \*